United States Patent
Mountain

(10) Patent No.: US 7,232,740 B1
(45) Date of Patent: Jun. 19, 2007

(54) METHOD FOR BUMPING A THIN WAFER

(75) Inventor: David J. Mountain, Baltimore, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 206 days.

(21) Appl. No.: 11/134,600

(22) Filed: May 16, 2005

(51) Int. Cl.
*H01L 21/30* (2006.01)
*H01L 21/46* (2006.01)

(52) U.S. Cl. ............... 438/459; 438/612; 438/106; 257/E21.229; 257/E21.509

(58) Field of Classification Search ............ 438/459, 438/106, 311, 455, 612, 628, 650, 686, 687, 438/688, 706, 745, 723, 743, 758, 762, 740
See application file for complete search history.

(56) References Cited

U.S. PATENT DOCUMENTS

| | | | |
|---|---|---|---|
| 3,753,238 A | 8/1973 | Tutelman | |
| 5,273,940 A * | 12/1993 | Sanders | 438/107 |
| 5,324,687 A * | 6/1994 | Wojnarowski | 438/107 |
| 5,691,245 A | 11/1997 | Bakhit et al. | |
| 5,817,541 A | 10/1998 | Averkiou et al. | |
| 5,998,291 A | 12/1999 | Bakhit et al. | |
| 6,013,534 A * | 1/2000 | Mountain | 438/15 |
| 6,017,822 A | 1/2000 | Mountain | |
| 6,228,686 B1 | 5/2001 | Smith et al. | |
| 6,291,877 B1 | 9/2001 | Usami et al. | |
| 6,365,974 B1 | 4/2002 | Abbott et al. | |
| 6,419,148 B1 | 7/2002 | Waxler et al. | |
| 6,506,681 B2 | 1/2003 | Grigg et al. | |
| 6,610,559 B2 | 8/2003 | Wang | |
| 6,627,998 B1 | 9/2003 | Caletka et al. | |
| 6,653,742 B1 | 11/2003 | Lin | |
| 6,716,665 B2 | 4/2004 | Baba et al. | |
| 6,881,648 B2 * | 4/2005 | Chen et al. | 438/459 |

FOREIGN PATENT DOCUMENTS

JP 56 60025 5/1981

OTHER PUBLICATIONS

Goodman, T. et al, "Wafer-Level Packaging Today", *Circuits Assembly*, Feb. 2004, pp. 28-32, www.circuitsassembly.com.

* cited by examiner

*Primary Examiner*—David Nhu
(74) *Attorney, Agent, or Firm*—Shlesinger, Arkwright & Garvey LLP; Terrence L. B. Brown

(57) ABSTRACT

Method of making a bumped thinned circuit wafer includes providing a silicon circuit wafer, and providing a conductive layer on it. Then, a first temporary support, such as a handle wafer, may be attached by an acrylic bond. The circuit wafer may then be thinned to a desired thickness, and the thinned circuit attached to a second temporary support, such as a transfer wafer. The handle wafer is removed, the thinned circuit wafer is bumped, and further processing steps may be carried out while the bumped thinned circuit wafer is still attached to the transfer wafer. When the desired processing steps are complete, the transfer wafer is removed, and the thinned circuit wafer with relatively thick solder bumps results.

22 Claims, 2 Drawing Sheets

METHOD FOR BUMPING A THIN WAFER

FIELD OF THE INVENTION

The invention relates to a method of making a thinned circuit wafer. More particularly, the method relates to fabricating a bumped thin circuit wafer. Even more particularly, the method relates to fabricating a very thin bumped thin circuit wafer that has solder bumps which may be relatively large compared to the thickness of the circuit wafer substrate.

BACKGROUND OF THE INVENTION

Bumped circuit wafers are known.

Applicant's earlier patents directed to semiconductor device manufacturing processes include:

U.S. Pat. No. 6,013,534 to Mountain, entitled "Method of Thinning Integrated Circuits Received in Die Form", issued Jan. 11, 2000, which is incorporated herein by reference; and U.S. Pat. No. 6,017,822 to Mountain, entitled "Method of Thinning Semiconducted Wafer of Smaller Diameter than Thinning Equipment Was Designed For", issued Jan. 25, 2000, and which is incorporated herein by reference.

Additional known United States patent documents include:

U.S. Pat. No. 6,506,681 to Grigg et al.;
U.S. Pat. No. 6,716,665 B2 to Baba et al.;
U.S. Pat. No. 6,419,148 B1 to Waxler et al.;
U.S. Pat. No. 3,753,238 to Tutelman; and
U.S. Pat. No. 6,610,559 B2 to Wang et al.

A known Japanese patent document is:

JP 56 60025 to Iguchi Shigeki, published May 23, 1981, and entitled "Bonding Method for Semiconductor Element".

Additional known U.S. patents include:

U.S. Pat. No. 5,691,245 to Bakhit et al.;
U.S. Pat. No. 5,817,541 to Averkiou;
U.S. Pat. No. 5,998,291 to Bakhit et al.;
U.S. Pat. No. 6,291,877 to Usami et al.;
U.S. Pat. No. 6,365,974 B1 to Abbott et al.;
U.S. Pat. No. 6,228,686 B1 to Smith et al.;
U.S. Pat. No. 6,627,998 B1 to Caletka et al.; and
U.S. Pat. No. 6,653,742 B1 to Lin.

A history of wafer-level packaging (WLP) is set forth in an article entitled "Wafer-Level Packaging Today", Goodman, T. et al., *Circuits Assembly*, February 2004, pages 28–32, www.circuitsassembly.com, and which is incorporated herein by references.

Known chip scale packages (CSP) are being used today instead of the larger large area packages used previously. The densest assemblies are those using flip-chip technology in order to place the CSP directly on a substrate. This technique is termed direct chip attached (DCA) technology. Densifying assemblies in this manner has been advantageously used in portable electronic devices.

Another known technology for densifying assemblies is the thinning of semiconductor devices.

Known techniques of thinning devices have been unsuited to fabricate both high yield and high reliability solder bumps. If semiconductor devices are thinned before a bumping step, known wafers are fragile and break easily during the bumping process. If semiconductor devices are thinned after bumping, the topography of the bumped wafer (e.g. height variations owing to the bumps) has made it difficult to produce wafers sufficiently thin to satisfy the requirements of extremely thin wafers.

U.S. Pat. No. 6,506,681 to Grigg et al. set forth above has described a method of making flip-chip assemblies which are thinned after bumping; however, that patent discloses a limitation when thinning prior to bumping of 250 microns, owing to the handling requirements for the bumping process that limit wafer thinness under traditional grinding methods.

Known techniques have likewise failed to keep up with the demand for compact, low profile applications, such as in the portable electronic market for pagers, cellular telephones, and the like. Each of those applications demands low profile packages. These demands severely constrain packaging parameters.

A currently known standard of bumping wafers includes providing solder bumps on the conductive layer on a chip. However, if the initial silicon substrate is too thin, it has been difficult to handle during processing without unacceptable die breakage levels.

When the conventional silicon substrate is sufficiently thick to reduce handling and breakage problems, there is a trade-off between reducing the chip scale package thickness and reducing breakage problems.

There is thus a need for a method of fabricating bumped thin circuit wafers that overcomes the drawbacks of the prior art.

It can be seen that there likewise is a need for a method of providing thinned bumped wafers that are thinner than known semiconductor devices.

OBJECTS AND SUMMARY OF THE INVENTION

It is an object of the invention to overcome the drawbacks of the prior art.

It is a further object of the invention to provide a thin circuit wafer.

It is a further object of the invention to provide a bumped thin wafer.

A still further object of the invention is to manufacture a bumped thin wafer which provides a greater solder bump thickness to wafer thickness ratio than known bumped wafers.

Another object of the invention is to provide for the manufacturing of circuit wafers having superior electrical and physical characteristics as compared to known circuit wafers.

Yet another object of the invention is to provide for the use of thinned acrylic bonding material during one or more of the fabrication steps.

A further object of the invention is to provide for the use of a releasable adhesive or bonding material for enhancing and simplifying the process of producing such circuit wafers.

Yet another object of the invention is to use a thin film process which eliminates the trade-off between reducing chip scale package thicknesses as compared with known technologies while providing the desired increased solder bump sizes and reliability.

Another object of the invention is to provide a method of fabricating bumped thinned circuits which are readily manufactured.

In summary, the invention is directed to a method of making a bumped thin wafer including providing a circuit wafer having a topside, a thickness, and an outer perimeter; and providing a conductive layer on the topside of the circuit wafer to yield a conductive layer having a topside. A first temporary support having a topside, a thickness, and an outer perimeter may be provided, the thickness being substantially constant, and the outer perimeter having an extent substantially the same as an extent of the outer perimeter of the circuit wafer. Attaching the topside of the conductive layer to the topside of the first temporary support, and then thinning the circuit wafer to a thickness of less than 10 microns to yield a thinned circuit wafer having a backside may be performed.

The invention likewise includes a method of bumping a thin circuit wafer, that includes providing a circuit wafer having a topside, a thickness, and a diameter, and providing a conductive layer on the topside of the circuit wafer to yield a conductive layer having a topside. One may then provide a handle wafer having a topside, a thickness, and a diameter, the thickness being substantially constant, and the diameter being substantially the same as the diameter of the circuit wafer. Further, the method may include providing an etch stop layer on the topside of the handle wafer and adhering the topside of the conductive layer to the etch stop layer on the topside of the handle wafer with an adhesive. The adhesive may include an acrylic thinned with acetone prior to applying the thinned acrylic to the handle wafer and prior to applying the thinned acrylic to the topside of the conductive layer of the circuit wafer. The adhered handle wafer and circuit wafer may be treated to yield a wafer stack including a thinned acrylic bond. The wafer stack may then be thinned by thinning a backside of the circuit wafer adhered to the handle wafer to yield a thinned circuit wafer having a backside. A transfer wafer may be attached to the backside of the thinned circuit wafer of the wafer stack. The handle wafer may be removed from the wafer stack, and bumping of the topside of the thinned circuit wafer to provide the desired solder bumps may be carried out.

The invention may include the attaching of one or more of the circuit wafer, the handle wafer, and the transfer wafer to each other by a thinned adhesive, such as an acrylic, which is readily removable with a solvent, such as acetone.

The bumped thinned circuit may include one or more conductive (e.g. metallization) layers.

The inventive thinned circuit wafer likewise may include a material yielding a conductive layer including oxides, polyimide or BCB (e.g., bisbenzocyclobutene or benzocyclobutane), copper/polyimide thin film interconnect layers, and/or a metal conductive layer including one or more of copper, nickel, and gold, for example.

The inventive method overcomes the prior art difficulty of providing relatively large solder bumps on relatively thin chips by thinning the chip just before the bumps are fabricated on the wafer. The wafer is planar at this point in the inventive method, and a variety of thinning methods can be used to achieve the desired thinning. The thin wafer remains attached (e.g., with a releasable adhesive) to a supporting substrate, such as a handle wafer, during the bumping process.

The inventive adhering step includes providing an adhesive having bonding, temperature, and material compatibility with the bumping and flip-chip processing. In that manner, high quality bumps may be formed after thinning of the wafer without the handling problems associated with known methods. Thanks to the inventive method, the thinning is virtually unlimited; wafers can be thinned down to the point at which the minimum amount of material necessary for functionality remains, which minimum amount may be approximately 2–15 microns depending on the device.

After completion of the bumping process, the wafer may be tested, diced, and flip-chip assembled in the manner of a known thickness chip scale package (CSP). The bonded supporting substrate may then be released, yielding the desired extremely dense assembly.

Relative terms such as left, right, topside, backside, height, width, up, and down are for convenience only and are not intended to be limiting.

DETAILED DESCRIPTION OF THE INVENTION

FIGS. 1–9 schematically show an embodiment of a method or process for producing a bumped thinned wafer according to the invention in the form of a series of Figures.

FIGS. 1–9 may be considered successive individual process steps, for ease of discussion; and, depending on the requirements of the end user, on the materials and processes used, and on the processing facilities available, each of FIGS. 1–9 may or may not be successive fabrication steps.

Figure 1:
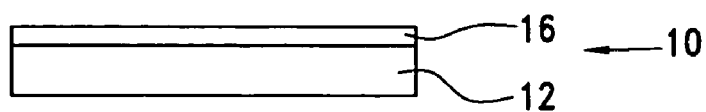
FIG. 1 schematically illustrates a step of a process for bumping a thinned wafer according to an embodiment of the invention in which a support, such as a silicon wafer, has been provided with a conductive layer.

An initial step shown in FIG. 1 may include providing a treated substrate 10 for fabricating the bumped wafer, which may be a silicon wafer.

Treated substrate 10 may be provided by supplying a first substrate 12, such as a silicon wafer, and then one may provide one or more of dielectrics including oxide, polyimide, or BCB.

Substrate 12 may be a six inch (e.g., a 150 mm) silicon wafer containing integrated circuits, for example, and the conductive coating 16 may be likewise provided by a known process termed wafer level packaging (WLP), involving the patterning of metal and dielectric layers. The metal interconnect may be, for example, a composite layer using material such as copper and nickel, with a thin gold surface.

In the case where the circuit wafer, whether fabricated or obtained from a supplier, is the type having conventional perimeter aluminum pads, good results have been achieved when the known perimeter aluminum pads have been redistributed (e.g., adding at least one conducting layer) to area array pads of solderable material such as gold. This may be termed wafer level packaging as referenced immediately above.

In the case where dielectrics, as described above, are used, the patterning may be done by photolithography or screen printing. After such process, the area array pads are ready to be patterned with solder bumps. If such solder bumps are to be electroplated, then the plating base layer is deposited.

The solder bumping may be carried out after further processing steps described below.

Figure 2:
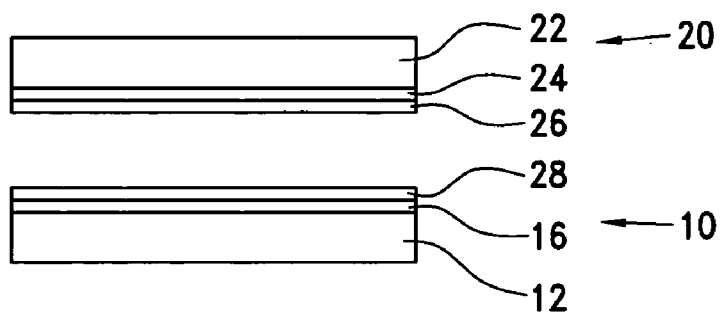
FIG. 2 schematically illustrates a step of a process for bumping a thinned wafer according to the invention in which a first temporary support, such as a handle wafer, has been provided with an etch stop layer and an adhesive layer, and the silicon wafer of FIG. 1 has been provided with an adhesive layer.

FIG. 2 schematically illustrates a further step of fabricating a bumped circuit wafer that includes providing a first temporary support or substrate 20 which may be a handle wafer.

The handle wafer 20 of FIG. 2 may be provided with an etch stop layer or coating 24 including an oxide layer and an aluminum layer. The oxide layer may be a 0.3 micron coating and the aluminum layer may be a 1.0 micron coating.

Good results have been achieved when the first temporary support 22 has a uniform thickness. Such uniform thickness has ensured that in a later wafer thinning step the thinned wafer is thinned uniformly.

An adhesive or bonding layer 26 may then be provided on etch stop layer(s) 24.

The fabricator may now perform a step of providing an adhesive 28 on a topside of the conductive layer 16 of FIG. 2.

First temporary support 20 may be in the form of a known handle wafer or other support or substrate configured for mating well with the wafer 10 of FIG. 2. Such mating has been achieved with good results by providing first temporary support 20 in the form of a substrate, such as a silicon wafer, which has the same width, extent, and outer perimeter as wafer 10; i.e., is substantially the same size and covers substantially the same footprint as viewed in plan. In this manner, wafer 10 is evenly supported over its entire extent during processing steps in which forces are exerted on wafer 10, for example. Such even support over its entire footprint has provided for the desired even thinning of wafer 10 in practice.

The handle wafer 22 may be made of a conventional material such as glass.

The handle wafer 22 material may also include a stainless steel, or any material compatible with the adhesive (e.g. acrylic) and the bonding process described immediately below.

Attaching of the handle wafer to wafer 10 may be carried out by bonding a topside of wafer 10 to the topside of handle wafer or first temporary support 20 with an adhesive material, such as BCB or acrylic, and the BCB or acrylic may be spun onto one or both of handle wafer 20 and the circuit wafer 10. For example, the BCB or acrylic may be spun onto a surface of the conductive layer 16 (onto a topside as shown) that will face the first temporary support 20, and the BCB or acrylic may likewise be spun on a counterpart surface of the first temporary support 20 which will face the conductive layer 16. A resultant wafer stack 40; i.e. adhered support 20 and circuit wafer 10 may then be soft baked in accordance with a known process, for example.

The adhesive of bonding layers 26 and 28 may include an acrylic, which has been spun onto both respective opposed wafer surfaces.

An acrylic used as the bonding material of layers 26 and 28 may include a commercially available acrylic material such as HumiSeal® 1B31 (HumiSeal® is a registered trademark of Chase Corporation, Braintree, Mass.), www.humiseal.com. Such commercially available HumiSeal® may be first diluted by 50% volume with acetone. Such dilution allows for deposition of a relatively thin, uniform layer of acrylic to be deposited on the wafer surfaces by spin coating.

Good results have been achieved when 5 ml of such a thinned acrylic has been manually or automatically dispensed onto a standard 150 mm/6 in silicon wafer, which wafer is then spun at 1500 rpm for 20 seconds. The wafer is then soft baked by contact heating with a surface at 120° C. for 300 seconds. This soft bake step has been found to sufficiently evaporate the acetone solvent from the resultant film, preventing bubble formation and leaving a uniform acrylic layer approximately 4 microns thick. The acrylic has been successfully coated onto the topside of etch stop layer 24 and on the top side of conductive layer 16 as shown; i.e. the acrylic coating is shown as bonding layers 26 and 28 respectively.

After both wafer surfaces have been coated with acrylic in that manner, the wafer surfaces may be bonded together using conventional wafer bonding equipment. Good results have been achieved when using an Electronic Visions wafer bonder available from EVGroup, Schärding, Austria (Electronic Visions Group, www.evgroup.com).

Figure 3:
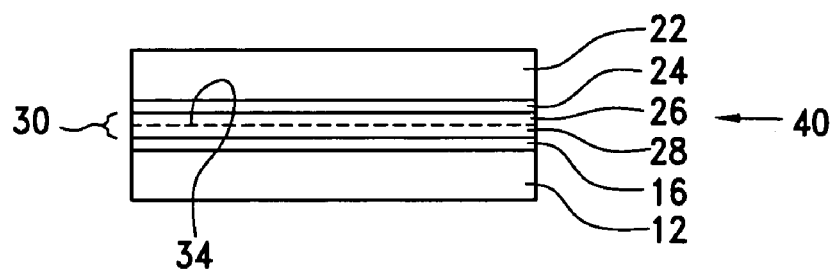
FIG. 3 schematically illustrates a step of a process for bumping a thinned wafer according to the invention in which the first temporary support and the silicon wafer have been bonded together to form a wafer stack.
Figure 4:
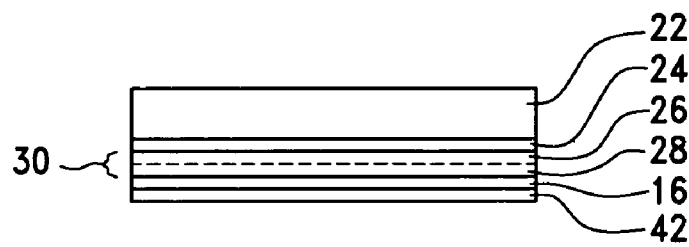
FIG. 4 schematically illustrates a step of a process for bumping a thinned wafer according to the invention in which a backside of the silicon wafer has been thinned.

This bonding of handle wafer 20 to circuit wafer 10 is shown in FIG. 3.

This bonding step of FIG. 3 may be accomplished by use of conventional bonding equipment set forth above, in which handle wafer 20 and circuit wafer 10 are mounted in a bond tool which aligns the respective wafers 10 and 20 by their flat surfaces and uses small, relatively thin separators at the perimeter to prevent the two wafers 10 and 20 from contacting each other. The bond tool is then placed in the chamber and the bonding system evacuates air in the chamber and heats the bonding tool to 200° C. At this time, the centers of wafer 10 and 20 are placed in contact and then the separators are removed. Wafers 10 and 20 are pressed together using a quartz bond plate applying a force of about 4,000 Newtons, which force is about 2 times atmospheric pressure. This pressure is applied for 5 minutes; then, the bond tool is cooled down to ambient, and the chamber is filled with nitrogen gas back to atmospheric pressure. At that point, the bond tool may be removed from the chamber, and the bonded wafers 10 and 20 (i.e. wafer stack 40) may be removed from the bond tool.

An interface 34 between layers 26 and 28 is shown to simply point out schematically the different layers which were used to produce layer 30.

Owing to the evacuation of the chamber and use of the separators, little or no air can be trapped when the respective adhesive layers 26 and 28 are contacted to form bonding layer 30. For example, in the case of acrylic, the elevated temperature and high pressure allow for the acrylic films to flow over any topography on the opposed surfaces of wafers 10 and 20 that is common for finished semiconductor device wafer. Therefore, no or substantially no voids are present in the resultant acrylic bond layer 30, and it is relatively strong, even though layer 30 is relatively thin. Good results have been achieved when layer 30 has been formed with a thickness of about 8 microns.

Wafer stack 40 and its various layers may be bonded together in standard wafer bonding equipment.

After the stack wafer bonding process of FIG. 3, the silicon substrate wafer 12 may be thinned by using a known, readily available process including one or more of etching, grinding, and polishing, for example. That thinning/removal may be a destructive removal process. Appropriate equipment is readily available for carrying out such processes of thinning the silicon wafer.

Figure 5:
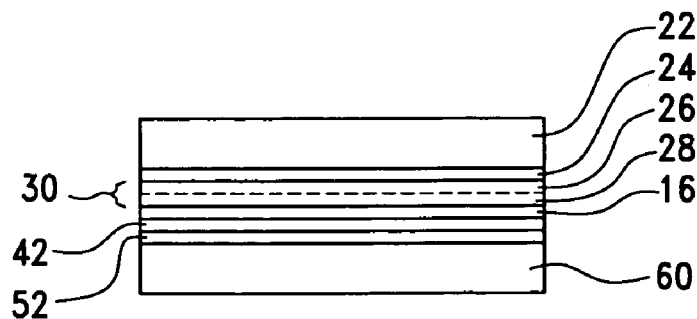
FIG. 5 schematically illustrates a step of a process for bumping a thinned wafer according to the invention in which a second temporary support, such as a transfer wafer, has been adhered or bonded to a backside of the thinned silicon wafer of FIG. 4.

After the silicon wafer 12 has been thinned in the step of FIG. 5, a thinned circuit wafer 42 of the desired thickness remains adhered to the first temporary support 22; e.g. the handle wafer.

The bonding and thinning processes described above are applicable to any type of semiconductor circuit, such as CMOS, SOI, Bipolar, and GaAs. No specially prepared device wafer or fabrication processes are required for the above described fabrication process steps to be successfully carried out.

FIG. 5 illustrates a step of adding an additional temporary support in the form of a second temporary support or transfer wafer 60 attached to thinned circuit wafer 42 by the use of a bond 52, such as an adhesive. Bond 52 may be an acrylic or other bonding material as discussed above, e.g., a thinned acrylic.

A blank silicon wafer has been successfully used as second temporary support or transfer wafer 60. Such transfer wafer may be a conventional 150 mm silicon wafer. After attaching the backside of thinned circuit wafer 42 to transfer wafer 60, first temporary support handle wafer 20 may be removed, such as by a destructive removal process including grinding, etching, and polishing of the handle wafer 20 down to etch stop layer 24.

Etch stop layer 24, such as an aluminum layer, may then be removed by a mixture of phosphoric, nitric, and acetic acids heated to 54° C. The etch time may be performed in about 120 seconds. The described acid solutions are readily commercially available.

Good results have been achieved owing to the acrylic bond layer serving to protect the device wafer from such an etch solution (e.g. an aluminum etch solution), when the respective wafers are coated, baked, and bonded as described above. It appears that bubble free acrylic coatings and void free acrylic bonds lead to the success of this method, and, indeed, may be critical to achieving the best results. Otherwise, it is believed that the acid(s) can penetrate the bond layer and attack the device wafer surface; especially as the acid may attack any area array pads or other metal layers, as described above, that may be present on the finished semiconductor device wafer, depending on the characteristics of the beginning and intermediate device wafer described above.

Good results have been achieved when a relatively short wet strip at ambient temperature in acetone readily removes the above-described original acrylic bond layer. This wet strip solvent has been successfully used without it attacking the device wafer.

Figure 6:
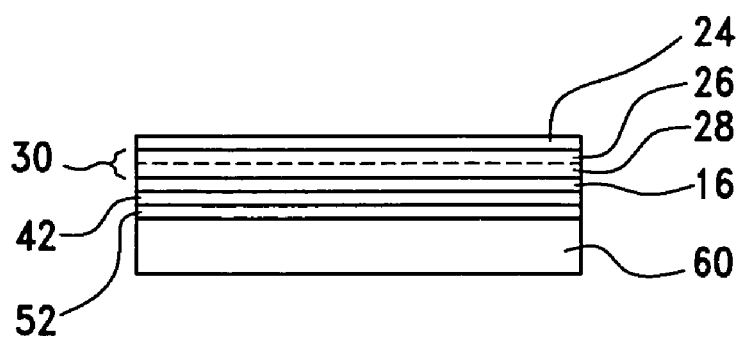
FIG. 6 schematically illustrates a step of a process for bumping a thinned wafer according to the invention in which the first temporary support of FIG. 5 has been removed.

FIG. 6 schematically shows a step of removing handle wafer 22, such as by a destructive removal process of the type described above for removing a wafer, as will be readily understood. The removal of handle wafer 22 may typically be performed by removal of such down to the etch stop layer 24.

Figure 7:
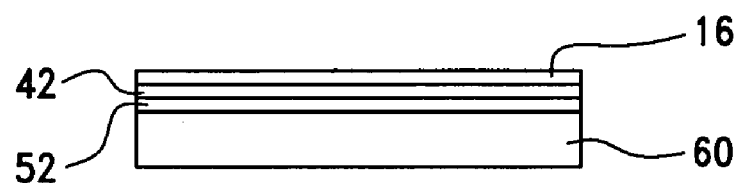
FIG. 7 schematically illustrates a step of a process for bumping a thinned wafer according to the invention in which at least the etch stop layer, and the adhesive or bonding layer, if desired, has been removed.

FIG. 7 shows this case where it is desired to have the etch stop layer 24 and bonding layer 30 removed. Such removal may be accomplished by using an acetone soak, in the case where acrylic has been used as the adhesive layer 30.

Figure 8:
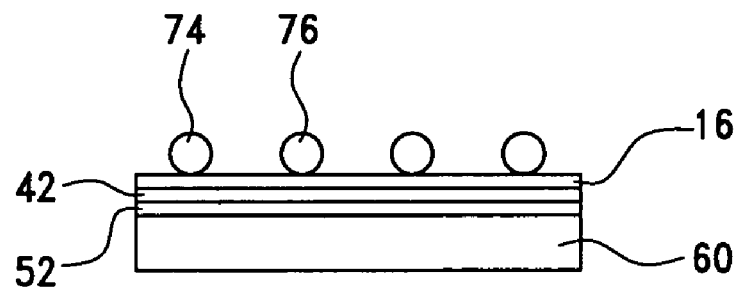
FIG. 8 schematically illustrates a step of a process for bumping a thinned wafer according to the invention in which one or more (as shown) solder bumps have been added to the conductive or metallization layer on the topside of the silicon wafer to yield a bumped thinned wafer.

FIG. 8 shows how a wafer level packaging (WLP) process e.g. the bumping process may then be completed, such as by electroplating, printing, or solder dispense. The above described acrylic transfer bond material is compatible with these bumping processes. Given that the device wafer may be thinned just prior to the bumping process, in accordance with the invention, relatively few process steps remain. In that manner, the likelihood of process or material incompatibilities is minimized. Thinned circuit wafer 42, as shown in FIG. 8, may be provided with one or more solder bumps 74 and 76, as shown.

Wafer bumps 74 and 76 are intentionally shown as having a height or thickness 82 which is greater than a thickness 86 of thinned wafer 42, in order to emphasize that such may be the case. Needless to say, wafer bump 74 and 76 need not be thicker than thinned circuit 42. Such is schematically shown in order to emphasize the relatively larger solder bumps which may be provided on a relatively thin circuit wafer 42 in accordance with the invention.

This method is believed to be compatible with most conventional solders in the industry, and bumps other than the usual solder, such as gold (Au) bumps may be provided, although it is contemplated that such may be more time-consuming to fabricate.

The thickness range of the thinned circuit wafers may be about 10–20 microns, and it is contemplated that the solder balls or bumps may be in the range of 20–50 microns, for example, although such is not intended to be limiting, merely as an example of ranges to be achieved.

The goal of providing solder bumps as large as needed for reliability, coupled with a circuit wafer as thin as possible to minimize its height and meet the requirements of thinner devices, has been achieved.

After the solder bumping of FIG. 8, any additional circuit wafer processing steps may be completed while transfer wafer 60 is still attached to thinned circuit wafer 42. For example, thinned circuit wafer 42, now a thin CSP, is capable of being tested, diced, and the like prior to its use in a multichip module (MCM).

Further, in the case where thinned chip 42 is still mounted to transfer wafer 60, the bumped thin circuit wafer may be flip-chip assembled, underfilled, and reflowed. In such cases, thanks to chip 42 still being mounted to transfer wafer 60, issues of handling difficulties are minimized.

Figure 9:
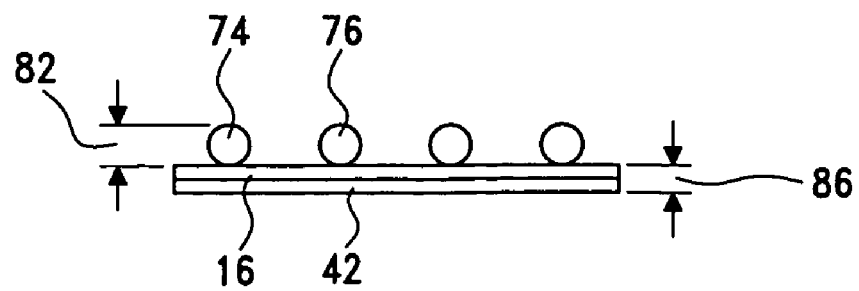
FIG. 9 schematically illustrates a step of a process for bumping a thinned wafer according to the invention in which the bumped thinned wafer is removed from the second temporary support after additional processing steps have been completed, for example.

At an appropriate time, as shown in FIG. 9, the finished thinned circuit wafer 42 may be released, such as after it has been attached to its final substrate, in use. The remaining acrylic bond 52 between handle wafer 60 and circuit wafer 42 may be dissolved in acetone.

Thinning the circuit wafer to a thickness of less than 5 or 10 microns to yield a thinned circuit wafer may be achieved.

Good results have been achieved when bumped thinned circuit wafers have been produced in accordance with the fabrication steps of the embodiment of FIGS. 1–9.

It is further contemplated that as regards circuit thinning other possible final steps may be included to maximize the uniformity of the thinning process:

1. if the circuit is fabricated on an SOI (silicon on insulator) wafer, the buried oxide layer serves as a natural etch stop for chemical solutions such as ethylene-diamine pyrocatechol (EPD) or tetramethyl ammo nium hydroxide (TMAH). In this case a layer of oxide or nitride may protect the back of the handle wafer;

2. if the circuit is fabricated on a wafer with a lightly doped epitaxial layer on top of a heavily doped substrate, as is common in many silicon processes, solutions of Nitric:HF:Acetic acid will preferentially etch the silicon with high doping levels. The interface between the two layers thus may serve as an etch stop;

3. if the circuit is fabricated on a standard bulk silicon wafer that does not contain any inherent endpoints; the circuit thickness can be accurately mapped using spectroscopic methods once the silicon is <50 microns thick. This information can be used to selectively remove additional silicon at the thicker locations to achieve a high degree of uniformity. Reactive Ion Etch (RIE) tools capable of this type of processing are commercially available; and 4. the circuit can be patterned on the front with trenches of various depths filled with suitable materials and thinned. The following is an example: Using high contrast material in the deepest trenches, periodic optical inspection would indicate a certain thickness had been reached using a faster process; a slower wet etch process could then be used until the process exposes trenches filled with material resistant to the etchant; a very uniform and repeatable polishing process could then remove material until the trenches filled with polish stop material are exposed thus providing an end point signal.

It is also contemplated that as regards backside processing:

1. after thinning is complete, the acrylic material is compatible with some processes that enhance the value of the thin circuit product;

2. single or multiple layers can be deposited on the back. Examples are aluminum to act as an electrical or thermal conductive layer, oxide to electrically isolate the semiconductor, or polyimide for mechanical strength; and 3. lithography can be used to pattern features. This means bulk or surface micromachining processes can be used to integrate MEMS with semiconductor circuits without restrictions on the wafer fabrication steps. This creates the capability for making three-dimensional microsystems with integrated electronics.

It is likewise contemplated that as regards transfer/release process steps:

1. for circuits with polyimide layers, after bonding of the transfer wafer and removal of the handle wafer; the circuit may actually be released to freestanding form and handled. Good results have been achieved when handling silicon circuitry thinner than 25 microns in freestanding form ranging in size from individual die up to six-inch (150 mm) wafers. These circuits have proven to be remarkably flexible. The ability to release circuits to freestanding form provides maximum freedom in selecting the final adhesive, substrate, and circuit orientation (face up or face down);

2. materials other than acrylics can be used for the transfer bond. An example is polyvinyl alcohol (PVA), which is water-soluble. If PVA is used, the thin circuit can be released using a water soak, which will be very benign to other components in the environment, including the materials used for attaching the thin circuit to its finals substrate. Polymethyl Methacrylate (PMMA), wax, or other materials may also be used as the transfer adhesive;

3. multiple transfers of the thin circuit are possible. This means the thin circuit can be placed face side up or down on its final substrate, depending on the application. It also means interim activities such as testing or dicing can take place before final placement. For example, the first bond is acrylic, the next is acrylic, the next is wax, and the like. Another 'bonding' material is the use of a vacuum, or the surface tension of a liquid such as water; and 4. specialized handle wafers can be used. For example, a substrate with a porous silicon layer on top can be used for the handle. After transfer bonding, a high-speed jet stream can split open the porous silicon layer, leaving only a thin silicon layer to be removed.

It is contemplated that as regards handle wafer removal:

1. if special release layers have been incorporated into the handle wafer, appropriate release mechanisms for them such as temperature, UV (ultraviolet) irradiation, etc. may be used.

It is also contemplated that as regards assembly release:

1. removal of vacuum, UV irradiation, water soaks, and the like, as needed, can be used. Use of porous supports and ultrasonic agitation will also greatly accelerate the release time, reducing it to a few minutes in some cases.

If adhesives instead of acrylic, yet which still sufficiently protect the thinned wafer during destructive removal steps, are used for one or both of bonding layers 26 and 28, different solvents may be used that are appropriate for dissolving or releasing such alternate adhesives.

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention or limits of the claims appended hereto.

What is claimed is:

1. Method of making a device, comprising:

a) providing a circuit wafer having a topside, a thickness, and an outer perimeter;

b) providing a conductive layer on the topside of the circuit wafer to yield a conductive layer having a topside;

c) providing a first temporary support having a topside, a thickness, and an outer perimeter, the thickness being substantially constant, and the outer perimeter having an extent substantially the same as an extent of the outer perimeter of the circuit wafer;

d) attaching the topside of the conductive layer to the topside of the first temporary support; and e) thinning the circuit wafer to a thickness of less than 10 microns to yield a thinned circuit wafer having a backside.

2. Method as in claim 1, further comprising:

a) providing a second temporary support; and b) attaching the second temporary support to the backside of the thinned circuit wafer.

3. Method as in claim 2, further comprising:

a) removing the first temporary support from the thinned circuit wafer; and b) adding a solder bump to the topside of the conductive layer of the thinned circuit wafer.

4. Method as in claim 1, wherein:
a) the topside of the conductive layer is attached to the first temporary support with an adhesive.

5. Method as in claim 4, wherein:
a) the adhesive includes an acrylic thinned with acetone to yield a thinned acrylic prior to applying the thinned acrylic to the first temporary support.

6. Method as in claim 4, wherein:
a) the adhesive includes an acrylic thinned with acetone prior to applying the thinned acrylic to the first temporary support and prior to applying the thinned acrylic to the topside of the conductive layer of the circuit wafer.

7. Method as in claim 4, wherein:
a) the adhesive includes a wax.

8. Method as in claim 1, wherein:
a) the conductive layer includes copper/polyimide thin film interconnect layers.

9. Method as in claim 1, wherein:
a) the conductive layer includes at least one of chromium, copper, nickel, and gold.

10. Method as in claim 1, wherein:
a) the circuit wafer includes perimeter aluminum pads, and the conductive layer is provided by redistributing the perimeter aluminum pads.

11. Method as in claim 1, wherein:
a) an etch stop layer is provided on the topside of the first temporary support.

12. Method of bumping a thin circuit wafer, comprising:
a) providing a circuit wafer having a topside, a thickness, and a diameter;
b) providing a conductive layer on the topside of the circuit wafer to yield a conductive layer having a topside;
c) providing a handle wafer having a topside, a thickness, and a diameter, the thickness being substantially constant, and the diameter of the handle wafer being substantially the same as the diameter of the circuit wafer;
d) providing an etch stop layer on the topside of the handle wafer;
e) adhering the topside of the conductive layer to the etch stop layer on the topside of the handle wafer with an adhesive, the adhesive including an acrylic thinned with acetone prior to applying the thinned acrylic to the handle wafer and prior to applying the thinned acrylic to the topside of the conductive layer of the circuit wafer;
f) treating the adhered handle wafer and circuit wafer to yield a wafer stack including a thinned acrylic bond;
g) thinning the wafer stack by thinning a backside of the circuit wafer adhered to the handle wafer to yield a thinned circuit wafer having a backside;
h) providing a transfer wafer;
i) attaching the backside of the thinned circuit wafer of the wafer stack to the transfer wafer;
j) removing the handle wafer from the wafer stack; and
k) bumping the topside of the thinned circuit wafer.

13. Method as in claim 12, wherein:
a) the thinned circuit wafer is thinned to a thickness of about 2–15 microns.

14. Method as in claim 12, wherein:
a) the etch stop layer includes an aluminum and an oxide layer.

15. Method as in claim 12, wherein:
a) the treating of the adhered handle wafer and circuit wafer includes soft baking of the wafer stack in a wafer bonding tool having a chamber, and sufficiently evacuating the chamber to preclude trapping of air in the thinned acrylic bond.

16. Method as in claim 13, wherein:
a) the thinned acrylic bond has a thickness of about 8 microns.

17. Method as in claim 12, wherein:
a) the thinned acrylic bond has a thickness of about 8 microns.

18. Method as in claim 12, wherein:
a) the transfer wafer is removed after the bumping of the thinned circuit wafer.

19. Method as in claim 12, wherein:
a) the circuit wafer is thinned just prior to the bumping of the thinned circuit wafer.

20. Method as in claim 15, wherein:
a) after the evacuating of the chamber of the wafer bonding tool, the chamber is filled with nitrogen gas.

21. Method as in claim 12, wherein:
a) the transfer wafer having a diameter, and the diameter of the transfer wafer being substantially the same as the diameter of the circuit wafer.

22. Method as in claim 1, further including the step of:
a) processing the backside of the thinned circuit wafer, wherein the step of processing consists of a method chosen from the group of methods consisting of layer deposition, spin coating, lithography, wet chemical etching, dry chemical etching, plating, dicing, any other suitable method, or any combination thereof.

* * * * *